United States Patent
Hofmann et al.

(10) Patent No.: US 6,593,614 B1
(45) Date of Patent: Jul. 15, 2003

(54) INTEGRATED CIRCUIT CONFIGURATION HAVING AT LEAST ONE TRANSISTOR AND ONE CAPACITOR, AND METHOD FOR FABRICATING IT

(75) Inventors: Franz Hofmann, München (DE); Wolfgang Krautschneider, Hohenthann (DE)

(73) Assignee: Infineon-Technologies AG, Munich (DE)

( * ) Notice: Subject to any disclaimer, the term of this patent is extended or adjusted under 35 U.S.C. 154(b) by 0 days.

(21) Appl. No.: 09/716,336

(22) Filed: Nov. 20, 2000

Related U.S. Application Data (63) Continuation of application No. PCT/DE99/01501, filed on May 19, 1999.

(30) Foreign Application Priority Data

May 19, 1998 (DE) .......................... 198 22 500

(51) Int. Cl.[7] ...................... H01L 27/108; H01L 29/76; H01L 29/94; H01L 31/119
(52) U.S. Cl. ...................... 257/306; 257/307; 257/308; 257/309
(58) Field of Search .................. 257/296, 306, 257/307, 308, 309; 438/253, 254, 396, 397, 398

(56) References Cited

U.S. PATENT DOCUMENTS

| | | | |
|---|---|---|---|
| 5,307,310 A | 4/1994 | Narita | |
| 5,429,976 A | 7/1995 | Hong et al. | |
| 5,497,017 A | 3/1996 | Gonzales | |
| 5,869,861 A | * 2/1999 | Chen | ........................ 257/296 |

FOREIGN PATENT DOCUMENTS

DE 195 19 160 C1 9/1996

OTHER PUBLICATIONS

"Vertical MOS Transistors with 70nm Channel Length" (Risch et al.), Siemens AG, Corporate Research and Development, MEI, Munich, Germany.
Patent Abstracts of Japan No. 04–09261 (Hideharu), date Oct. 30, 1992.

* cited by examiner

*Primary Examiner*—Steven Loke
*Assistant Examiner*—Thien F Tran
(74) *Attorney, Agent, or Firm*—Laurence A. Greenberg; Werner H. Stemer; Gregory L. Maybeck (57) ABSTRACT

A patterned conductive layer and a structure via which a transistor can be driven, e.g. a word line, are disposed one above the other. A vertical conductive structure, e.g. a spacer, connects a first source/drain region of the transistor to the conductive layer, with which it forms a first capacitor electrode which has a large effective area in conjunction with a high packing density. A capacitor dielectric is disposed over the vertical conductive structure and the conductive layer, and a second capacitor electrode is disposed over the capacitor dielectric. The vertical conductive structure may be disposed on a first sidewall of the first source/drain region and a gate electrode of the transistor may be disposed on an adjoining second sidewall of the first source/drain region. The circuit configuration may form a DRAM cell configuration.

8 Claims, 6 Drawing Sheets

INTEGRATED CIRCUIT CONFIGURATION HAVING AT LEAST ONE TRANSISTOR AND ONE CAPACITOR, AND METHOD FOR FABRICATING IT

CROSS-REFERENCE TO RELATED APPLICATION

This is a continuation of copending International Application PCT/DE99/01501, filed May 19, 1999, which designated the United States.

BACKGROUND OF THE INVENTION

Field of the Invention

The invention relates to an integrated circuit configuration having at least one transistor and one capacitor, and also to a method for fabricating it.

With regard to ever faster components at a higher integration level, the feature sizes of integrated circuit configurations decrease from generation to generation. At the present time, the integrated circuit configurations are usually realized using a planar silicon technology in which the components are disposed next to one another and are connected to one another via a plurality of metallization planes.

If an integrated circuit configuration contains a transistor, then its packing density can be increased by configuring the transistor as a vertical transistor. The reference by L. Risch et al., titled "Vertical MOS-Transistors With 70 nm Channel Length", ISSDERC 1995, pages 101 to 104, describes vertical MOS transistors in which, in order to fabricate them, layer sequences having layers corresponding to source, channel and drain are formed and are annularly surrounded by a gate electrode.

A further possibility for increasing the packing density of an integrated circuit configuration consists in disposing two components one above the other. German Patent DE 195 19 160 C1 proposes a dynamic random access memory (DRAM) cell configuration in which a storage capacitor is disposed above a selection transistor. A first source/drain region, a channel region disposed underneath and a second source/drain region, disposed underneath, of the selection transistor are parts of a projection-like semiconductor structure which is annularly surrounded by a gate electrode. Mutually adjoining gate electrodes form word lines. The first source/drain region also acts as a first capacitor electrode of the storage capacitor. A capacitor dielectric is disposed over the first capacitor electrode, and a second capacitor electrode is disposed over the capacitor dielectric, the second capacitor electrode acting as a common capacitor plate for all the storage capacitors of the DRAM cell configuration. The area of a memory cell of the DRAM cell configuration may be $4F^2$, where F is the minimum feature size that can be fabricated in the technology used.

SUMMARY OF THE INVENTION

It is accordingly an object of the invention to provide an integrated circuit configuration having at least one transistor and one capacitor, and a method for fabricating it, that overcome the above-mentioned disadvantages of the prior art methods and devices of this general type.

With the foregoing and other objects in view there is provided, in accordance with the invention, an integrated circuit. The integrated circuit contains a transistor having a first source/drain region and a second source/drain region, and a capacitor having a dielectric layer, a first capacitor electrode, and a second capacitor electrode adjoining the dielectric layer. An insulating layer is provided and a patterned conductive layer is disposed above the insulating layer. A structure through which the transistor can be driven is disposed beneath the patterned conductive layer, the insulating layer isolating the structure from the patterned conductive layer. A vertical conductive structure having a first region, a second region and a third region disposed one above another with respect to a vertical axis is provided, the second region is disposed between the first region and the third region. The first region of the vertical conductive structure laterally adjoins the conductive layer, and the third region of the vertical conductive structure adjoins the first source/drain region of the transistor. The patterned conductive layer and the vertical conductive structure together form the first capacitor electrode of the capacitor, and the dielectric layer adjoins the vertical conductive structure and the conductive layer. An insulating structure laterally adjoins the structure through which the transistor can be driven. The second region of the vertical conductive structure laterally adjoins the insulating structure.

The invention is based on the problem of specifying an integrated circuit configuration having at least one transistor and one capacitor in which the first source/drain region of the transistor is connected to the first capacitor electrode of the capacitor, in which the capacitor has a high capacitance and which can nevertheless be fabricated with a high packing density.

In the case of an integrated circuit configuration according to the invention, a structure via which the transistor can be driven and the patterned conductive layer which is part of the first capacitor electrode of the capacitor are disposed one above the other. An insulating layer isolates the structure via which the transistor can be driven from the conductive layer. Disposing the conductive layer and the structure via which the transistor can be driven one above the other increases the packing density of the circuit configuration compared with embodiments of the prior art, in which the first capacitor electrode and the structure via which the transistor can be driven are disposed next to one another.

A vertical conductive structure is provided as a further part of the first capacitor electrode. Which structure, having a first region, laterally overlaps the conductive layer, is insulated, at a second region, by an insulating structure from the structure via which the transistor can be driven, and, with a third region, overlaps a first source/drain region of the transistor. The second region is disposed between the first region and the third region. The first region, the second region, and the third region of the vertical conductive structure are disposed one above the other with respect to a vertical axis, that is to say an axis that is vertical with respect to the layer planes. The insulating structure laterally adjoins the structure via which the transistor can be driven. The second region of the vertical conductive structure laterally adjoins the insulating structure. A capacitor dielectric adjoins the conductive layer and the vertical conductive structure, and is in turn adjoined by a second capacitor electrode of the capacitor. On account of the vertical conductive structure, an effective surface area of the first capacitor electrode is greater than its projection onto a horizontal plane, which is highly advantageous since a capacitance of the capacitor can be increased without reducing the packing density of the circuit configuration.

Furthermore, a particularly high packing density of the circuit configuration results from the fact that at least one sidewall of the structure via which the transistor can be driven is utilized for enlarging the surface area of the first capacitor electrode.

Moreover, it is advantageous that the vertical conductive structure allows the connection between the first source/drain region of the transistor and the conductive layer even though, in terms of the height, that is to say with respect to the vertical axis, the structure via which the transistor can be driven is disposed between them.

A "spacer" is understood to be a structure formed on a lateral area of an at least approximately step-shaped structure when material is deposited essentially conformally and etched back anisotropically until horizontal areas of the step-shaped structure are uncovered.

It is advantageous to configure the vertical conductive structure as a spacer since the spacer has a small horizontal dimension, and a particularly high packing density can thus be attained. The connection between the first source/drain region of the transistor and the conductive layer occupies a particularly small horizontal area, which is why a horizontal cross section of the capacitor or of the first source/drain region may also turn out to be small.

The transistor may be disposed higher than the conductive layer. In this case, the third region of the vertical conductive structure is disposed higher than the first region of the vertical conductive structure.

The transistor may be disposed at a greater depth than the conductive layer. In this case, the first region of the vertical conductive structure is disposed higher than the third region of the vertical conductive structure.

The structure via which the transistor can be driven may be a gate electrode of the transistor. In this case, the gate electrode is disposed, in the vertical direction, between a channel region of the transistor, the channel region being provided with a gate dielectric, and the capacitor. The channel region is disposed, in the horizontal direction, between the first source/drain region and a second source/drain region of the transistor. The conductive layer is disposed over the transistor, and, with a lower, essentially horizontal area, the third region of the vertical conductive structure adjoins the first source/drain region.

As an alternative, the structure via which the transistor can be driven is not the gate electrode per se but rather is merely connected to the gate electrode. In this case, the structure via which the transistor can be driven may be disposed between the first source/drain region and the capacitor. The transistor and the conductive layer are thus disposed one above the other. The structure via which the transistor can be driven is isolated from the first source/drain region by a further insulating layer.

A particularly high packing density can be attained if the vertical conductive structure adjoins a first sidewall of the first source/drain region and a first sidewall of the first capacitor electrode.

If the first source/drain region projects beyond the insulating structure in the horizontal direction in the third region of the vertical conductive structure, and if the first source/drain region is located at a greater depth than the conductive layer, then, with its lower area, the third region of the vertical conductive structure may adjoin the first source/drain region. Conversely, with its lower area, the first region may adjoin the conductive layer if the conductive layer projects beyond the insulating structure in the horizontal direction in the first region of the vertical conductive structure and the capacitor is located at a greater depth than the first source/drain region.

In order that the horizontal dimension of the vertical conductive structure may be as small as possible and can overlap the first sidewall of the first source/drain region and the first sidewall of the conductive layer, it is advantageous if the sidewalls are essentially parallel to one another and do not have an excessively large spacing from one another in the horizontal direction. The spacing is preferably approximately equal to the horizontal dimension of the insulating structure.

In order to increase the packing density, it is advantageous if the horizontal dimension of the insulating structure is small. The insulating structure is in the form of a spacer, for example. As an alternative, the insulating structure can be produced by thermal oxidation of a sidewall of the structure via which the transistor can be driven on which the vertical conductive structure is disposed.

If the transistor is located at a greater depth than the conductive layer, then care must be taken, particularly in the case of thermal oxidation, to ensure that the insulating structure does not cover the entire first source/drain region, since otherwise the vertical conductive structure cannot directly adjoin the first source/drain region. One possibility for ensuring this consists in producing the first source/drain region after the production of the insulating structure by patterning a conductive region, etching being effected selectively with respect to the insulating structure. As a result, the first sidewall of the first source/drain region is produced after the production of the insulating structure, and the vertical conductive structure can be produced in a manner adjoining the first source/drain region. If the first sidewall of the conductive layer and the sidewall of the structure via which the transistor can be driven lie in the same plane, then the first sidewall of the conductive layer and the first sidewall of the first source/drain region do not lie in the same plane, since etching is effected selectively with respect to the insulating structure which adjoins the sidewall of the structure via which the transistor can be driven, and has a finite horizontal dimension.

The conductive region may be realized e.g. as a doped region in a substrate containing semiconductor material.

An advantageous method is described below in which the capacitor, the structure via which the transistor can be driven, and the first source/drain region are produced one above the other in a self-aligned manner, that is to say without the use of masks to be aligned.

The conductive region is produced at a surface of the substrate. At least a first insulating layer, a first conductive layer, a second insulating layer and a second conductive layer, which corresponds to the conductive layer mentioned above, are produced. A depression that cuts through at least the first conductive layer is produced. The first insulating layer may serve as an etching stop in this case. An insulating material is deposited and etched back to an extent such that the insulating structure in the form of a spacer is produced, which laterally covers the first conductive layer. The depression is deepened, so that the region is cut through, etching being effected selectively with respect to the insulating structure. The vertical conductive structure is produced by depositing and anisotropically etching back conductive material, which structure overlaps the region, the insulating structure and the second conductive layer. The first capacitor electrode of the capacitor is produced form the second conductive layer and the vertical conductive structure, the structure via which the transistor can be driven is produced from the first conductive layer, and the first source/drain region of the transistor is produced from the region. The deeper the depression, the larger the surface area of the first capacitor electrode and the higher the capacitance of the capacitor.

If the integrated circuit configuration is a memory cell configuration, e.g. a DRAM cell configuration, then the structure via which the transistor can be driven may be a word line. Memory cells of the memory cell configuration each contain a transistor and a capacitor, which are connected to one another via a vertical conductive structure. A second source/drain region of the transistor is connected to a bit line.

As an alternative, the structure via which the transistor can be driven serves for connecting the transistor to another component.

It is advantageous to configure the transistor as a planar transistor since it is possible to use the standard technology for producing the transistor in this case.

In order to increase the packing density, it is advantageous if the transistor is configured as a vertical transistor, The transistor is disposed under the conductive layer, for example. In this case, a channel region of the transistor is disposed under the first source/drain region. The gate electrode is disposed on a continuation—formed by the channel region—of a second sidewall of the first source/drain region. The gate electrode is isolated from the channel region by a gate dielectric and is connected to the structure via which the transistor can be driven.

It lies within the scope of the invention for the word line to run parallel to the first sidewall of the first source/drain region and to the surface of the substrate. In order to increase the packing density it is advantageous in this case if the second sidewall of the first source/drain region adjoins the first sidewall of the first source/drain region, the first sidewall being adjoined by the vertical conductive structure. The second sidewall of the first source/drain region is provided with insulation that electrically insulates the gate electrode from the first source/drain region. The gate electrode is disposed under the word line, which increases the packing density. The gate electrode may be produced together with the word line and is then a vertical protuberance of the word line.

The insulation and the gate dielectric may be contiguous and produced simultaneously. The insulation and the gate dielectric may be parts of the first insulating layer.

In order to reduce a capacitance formed by the gate electrode or the structure via which the transistor can be driven and the first source/drain region, it is advantageous, in the case where the insulation and the gate dielectric are parts of the first insulating layer, if parts of the first insulating layer which do not act as the gate dielectric are thicker than the gate dielectric. This is the case, for example, if the first insulating layer is produced by thermal oxidation, since the thermal oxidation progresses more rapidly in the region of more highly doped regions and the resulting oxide is thicker than in the case of lightly doped regions.

In order to simplify the process, in order to increase the capacitance of the capacitor and in order to improve contact-making, it is advantageous if a further vertical conductive structure which is analogous to the vertical conductive structure and connects the first source/drain region to the conductive layer adjoins a third sidewall of the first source/drain region, the third sidewall being opposite the first sidewall.

First trenches may be provided which run transversely with respect to the word line and which are disposed between the first source/drain regions of the transistors. The gate electrodes are disposed in the first trenches. In order that the gate electrode does not drive two different transistors, structures that prevent the formation of channels adjoin first sidewalls of the first trenches at least in the region of channel regions of the transistors. This is equivalent to saying that one of the structures which prevent the formation of channels adjoins a fourth sidewall of the first source/drain region, the fourth sidewall being opposite the second sidewall of the first source/drain region, and also adjoins the continuation of the source/drain region, the continuation being formed by the channel region.

The structures that prevent the formation of channels may be formed in the form of channel stop regions by the first sidewalls of the first trenches being doped, by inclined implantation, more highly than the channel regions. This can be done with or without a mask. If a mask is used, then it covers for example parts of the first sidewalls of the first trenches at which the gate electrodes are not disposed.

As an alternative, the structures that prevent the formation of channels may be produced from insulating material. To that end, the insulating material may be deposited in such a way that the first trenches are filled. Afterwards, the insulating material is removed, e.g. by a photolithographic method, at least from parts of the second sidewalls of the first trenches at which the gate electrodes are disposed, whereby the structures that prevent the formation of channels are produced.

A mask used in this process may be in strip form, its strips running parallel to the first trenches and covering the first sidewalls of the first trenches. As an alternative, the mask covers rectangular regions that do not overlap the parts of the second sidewalls of the first trenches at which the gate electrodes are disposed. This is particularly advantageous since, if the word lines are produced by depositing and patterning conductive material, the conductive material does not have to be etched as far as the bottoms of the first trenches.

In order that the word lines can be produced by depositing and patterning conductive material, it is advantageous for the insulating material with which the first trenches are filled to be planarized, before the production of the structures which prevent the formation of channels, until the surface of the substrate and thus the first source/drain regions are uncovered, and no insulating material is present outside the first trenches.

The depression in which the vertical conductive structure is disposed may be part of one of second trenches running transversely with respect to the first trenches. The first source/drain regions are isolated from one another by the first trenches and the second trenches. The word lines may be produced by the production of the second trenches. If, in this case, the strip-type mask is used in the production of the structures that prevent the formation of channels, then further depressions are produced in regions in which the first trenches and the second trenches intersect. It is advantageous to fill these further depressions by depositing and etching back insulating material.

An advantageous method is described below in which the capacitor, the word line and the first source/drain region are do produced one above the other in a self-aligned manner, that is to say without the use of masks to be aligned. A region containing strips disposed between the first trenches is produced at the surface of the substrate. After the production of the structures that prevent the formation of channels, and of the first insulating layer which partly acts as a gate dielectric and which also covers the surface of the substrate, a first conductive layer is deposited. Over the first conductive layer, a second insulating layer is deposited, and over the latter a second conductive layer is deposited. The production of the second trenches reaching down to the first insulating layer results in the word lines being produced from the first conductive layer. After the production of the second trenches, an insulating material is deposited and etched back, thereby producing the insulating structures in the form of spacers. Afterwards, the second trenches are deepened, etching being effected selectively with respect to the insulating structures. The region is cut through in the process. The first source/drain regions are produced from the region. If the insulating structures cover sidewalls of the patterned second conductive layer, the insulating structures are etched back until the sidewalls are at least partly uncovered. In order to produce the vertical conductive structures, conductive material is deposited and etched back. The vertical conductive structures cover the sidewalls of the second conductive layer and the first and third sidewalls of the first source/drain regions. Afterwards, the second conductive layer and the vertical conductive structures are patterned with the aid of a mask corresponding to the mask for producing the first trenches. In the process, the mutually isolated first capacitor electrodes are produced from the second conductive layer and the vertical conductive structures. Two of the vertical conductive structures in each case make contact with parts of the patterned second conductive layer. The same applies to the first source/drain regions. A capacitor dielectric is deposited over the first capacitor electrodes and further conductive material is deposited over the capacitor dielectric, the material forming a second capacitor electrode which is common to all the capacitors of the memory cell configuration.

To ensure that the second conductive layer is not attacked when the second trenches are deepened, it is advantageous to produce an auxiliary layer over the second conductive layer. Etching is effected selectively with respect to the auxiliary layer in the course of the deepening process.

To ensure that a potential at the second capacitor electrode does not produce any channels between the first source/drain regions which are adjacent to one another transversely with respect to the word line, an implantation may be carried out before the production of the second capacitor electrode or of the vertical conductive structures. As a result of which channel stop structures in the form of further channel stop regions, which are doped more highly than the channel regions, are produced at least at bottoms of the second trenches. As an alternative, the channel stop structures are produced from insulating material in the form of further insulating structures which adjoin the bottoms of the second trenches, by the second trenches being deepened to a particularly great extent and being partly filled e.g. by depositing and etching back the insulating material. The channel stop structures do not completely fill the deepened parts of the second trenches, in order that the vertical conductive structures can make contact with the first source/drain regions.

A second source/drain region of the transistor may be disposed underneath the channel region or in a manner offset diagonally downward with respect to the channel region, that is to say laterally with respect to, and at a greater depth than, the channel region. In the first case, the first trenches and/or the second trenches can pattern a layer sequence corresponding to source, channel and drain regions. In the second case, an implantation can be carried out after the production of the first trenches, whereby the second source/drain region is produced at bottoms of the first trenches. If the integrated circuit configuration is a memory cell configuration, bit lines are produced along the bottoms of the first trenches, and partly act as second source/drain regions of the transistors.

The region from which the first source/drain regions are produced may be produced e.g. over the whole area and subsequently be patterned in strip form by the first trenches. As an alternative, the region is produced in the form of strips by implantation being effected after the production of the first trenches.

The memory cells may each be produced with an area of $4F^2$, where F is the minimum feature size that can be produced in the technology used.

Other features which are considered as characteristic for the invention are set forth in the appended claims.

Although the invention is illustrated and described herein as embodied in an integrated circuit configuration having at least one transistor and one capacitor, and a method for fabricating it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2c is a cross-sectional view, parallel to the cross section shown in FIG. 2a and taken along the line IIC—IIC shown in FIG. 4, through the first substrate after the process steps from FIG. 2a;

FIG. 3b is a cross-sectional of FIG. 2b after the process steps of FIG. 3a;

DESCRIPTION OF THE PREFERRED EMBODIMENTS

In all the figures of the drawing, sub-features and integral parts that correspond to one another bear the same reference symbol in each case. The figures of the drawing are also not shown to scale. Referring now to the figures of the drawing in detail and first, particularly, to FIG. 1 thereof, there is shown in a first exemplary embodiment having a first substrate 1 containing silicon. The first substrate 1 contains a p-doped well WA that adjoins a surface O of the first substrate 1 and has a depth of approximately 600 nm. The dopant concentration of the well WA is approximately $10^{17}$ cm$^3$.

Figure 4:
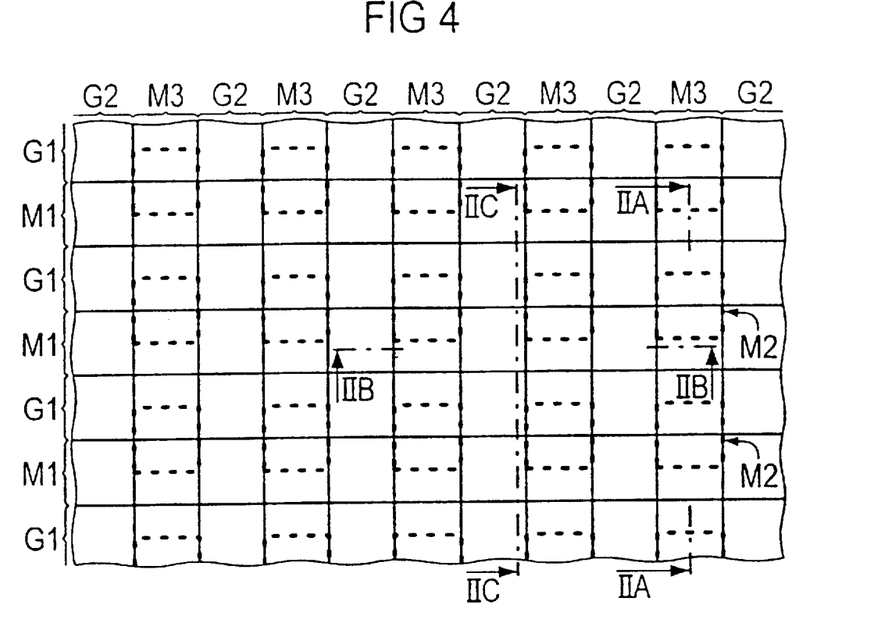
FIG. 4 is a plan view of the first substrate in which the first trenches, the second trenches, a first mask, a second mask and a third mask are illustrated.

With the aid of a first mask M1 (FIG. 4) made of photoresist, first trenches G1 (FIG. 1) are produced, which essentially run parallel to one another, have a width of approximately 200 nm and have a spacing of approximately 200 nm from one another. The first trenches G1 have a depth of approximately 600 nm.

Figure 1:
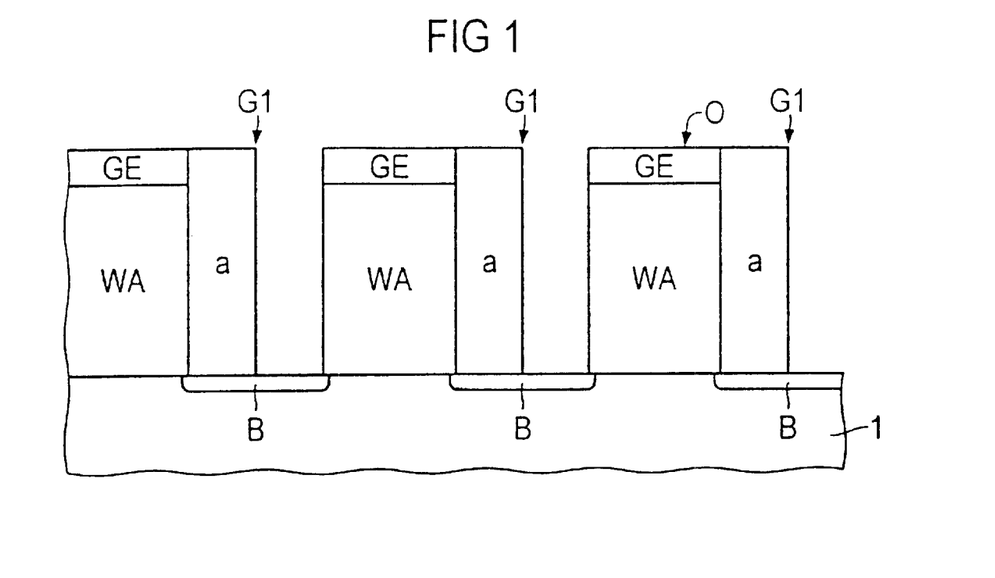
FIG. 1 is a diagrammatic, cross-sectional view of a first substrate after a well, first trenches, a region, bit lines and structures which prevent the formation of channels have been produced according to the invention.

Implantation is carried out to produce n-doped bit lines B, running along bottoms of the first trenches G1, and, at the surface O an n-doped region GE having a depth of approximately 50 nm and containing a plurality of strips is disposed between the trenches G1. The dopant concentration of the bit lines B and of the doped region GE is greater than approximately $10^{20}$ cm$^{31\ 3}$.

Afterwards, SiO$_2$ is deposited to a thickness of approximately 600 nm, the first trenches G1 thereby being filled. SiO$_2$ is removed and planarized by chemical mechanical polishing until the regions GE are uncovered. With the aid of a second mask M2 (FIG. 4) made of photoresist, which does not cover rectangular regions, SiO$_2$ is etched until the bit lines B are partly uncovered. Structures "a" that adjoin first sidewalls of the first trenches G1 and do not adjoin parts of second sidewalls of the first trenches G1 are produced in the process (see FIG. 1). The rectangular regions have a width of approximately 200 nm and a length of approximately 200 nm and overlap the first sidewalls of the first trenches G1. Rectangular regions that are adjacent to one another along the first trenches G1 have a spacing of approximately 200 nm from one another (see FIG. 4). The structures "a" are formed in each case contiguously along the first trenches G1.

Figure 2A:
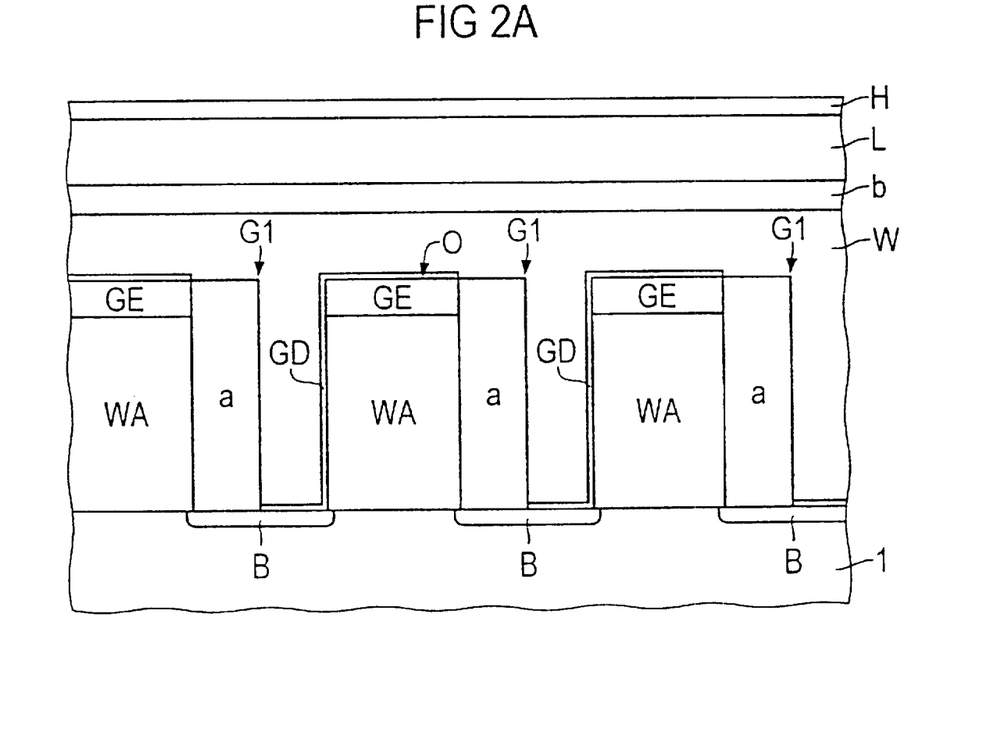
FIG. 2a is a cross-sectional view taken along the line IIA—IIA shown in FIG. 4, after a first insulating layer, word lines, a second insulating layer, a conductive layer, an auxiliary layer and second trenches have been produced.

A thermal oxidation is carried out in order to produce a first insulating layer GD (see FIG. 2A). Since the dopant concentration of the bit lines B and of the region GE is higher than that of the well WA, the first insulating layer GD is thinner in the region of the well WA than in the region of the regions GE and of the bit lines B. These facts are not illustrated in the figures.

A first conductive layer W is produced by depositing and planarizing in-situ-doped polysilicon. A second insulating layer b having a thickness of approximately 100 nm is produced by depositing SiO$_2$ over the first conductive layer W. A second conductive layer L having a thickness of approximately 400 nm is produced by depositing in-situ-doped polysilicon over the second insulating layer b. An auxiliary layer H having a thickness of approximately 50 nm is produced by depositing silicon nitride over the second conductive layer L (see FIGS. 2A and 2B).

Figure 2B:
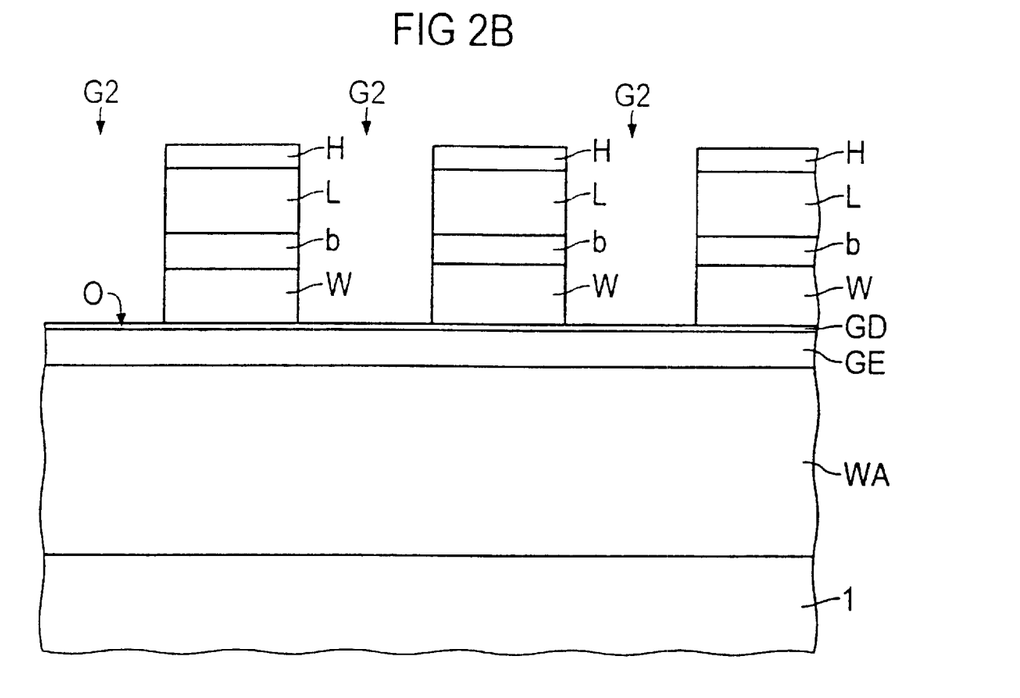
FIG. 2b is a cross-sectional view, perpendicular to the cross-sectional view of FIG. 2a and taken along the line IIB—IIB shown in FIG. 4, through the first substrate after the process steps from FIG. 2a have been completed.
Figure 2C:
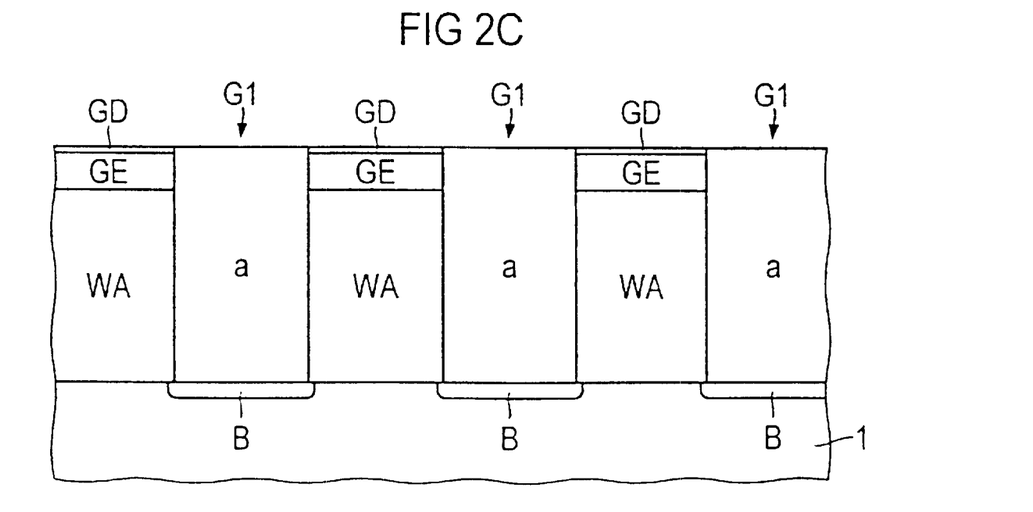

In order to produce second trenches G2 running transversely with respect to the first trenches G1, the auxiliary layer H, the second conductive layer L, the second insulating layer b and the first conductive layer W are etched, with the aid of a strip-type third mask M3 made of photoresist, until parts of the first insulating layer GD which are disposed between the first trenches G1 are uncovered (see FIG. 2B which is a view perpendicular to FIG. 2A). The first insulating layer GD serves as an etching stop. Word lines W are produced from the first conductive layer W in the process (see FIGS. 2A and 2B).

In order to produce insulating structures c (FIG. 3B), silicon nitride is deposited conformally to a thickness of approximately 20 nm and etched back until the auxiliary layer H is uncovered. The insulating structures c are produced in the form of spacers on sidewalls of the second trenches G2.

Afterwards, by etching using e.g. C$_2$F$_6$, C$_3$F$_8$, those parts of the first insulating layer GD which are disposed on the surface O of the substrate 1 are removed selectively with respect to the auxiliary layer H and with respect to the insulating structures c.

Figure 3A:
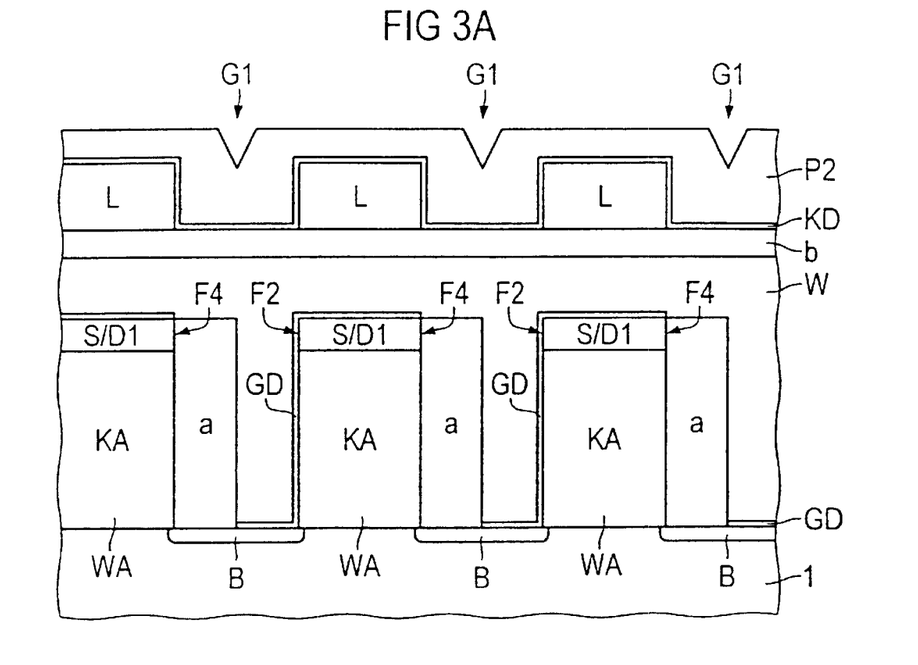
FIG. 3a is a cross-sectional view after insulating structures have been produced, the second trenches have been deepened, and channel stop structures, vertical conductive structures, a capacitor dielectric and a second capacitor electrode have been produced.

By etching silicon selectively with respect to silicon nitride using e.g. NF$_3$, HBr, He, O$_2$, the second trenches G2 are deepened, so that they cut through the region GE. First source/drain regions S/D1 of vertical transistors are produced from the region GE in the process. The deepened second trenches G2 extend approximately 100 nm into the first substrate 1 (see FIG. 3B). First sidewalls F1 of the first source/drain regions S/D1 are formed by the second trenches G2. Second sidewalls F2 of the first source/drain regions S/D1 adjoin the first sidewalls F1 of the first source/drain regions S/D1 (FIG. 3A). Parts of the word lines W are disposed on the second sidewalls F2 of the first source/drain regions S/D1. Third sidewalls F3 of the first source/drain regions S/D1 adjoin the second sidewalls F2 of the first source/drain regions S/D1, are opposite the first sidewalls F1 of the first source/drain regions S/D1 and are formed by the second trenches G2 (FIG. 3A). Fourth sidewalls F4 of the first source/drain regions S/D1 are opposite the second sidewalls F2 of the first source/drain regions S/D1. The structures "a" are disposed on the fourth sidewalls F4 of the first source/drain regions S/D1.

Figure 3B:
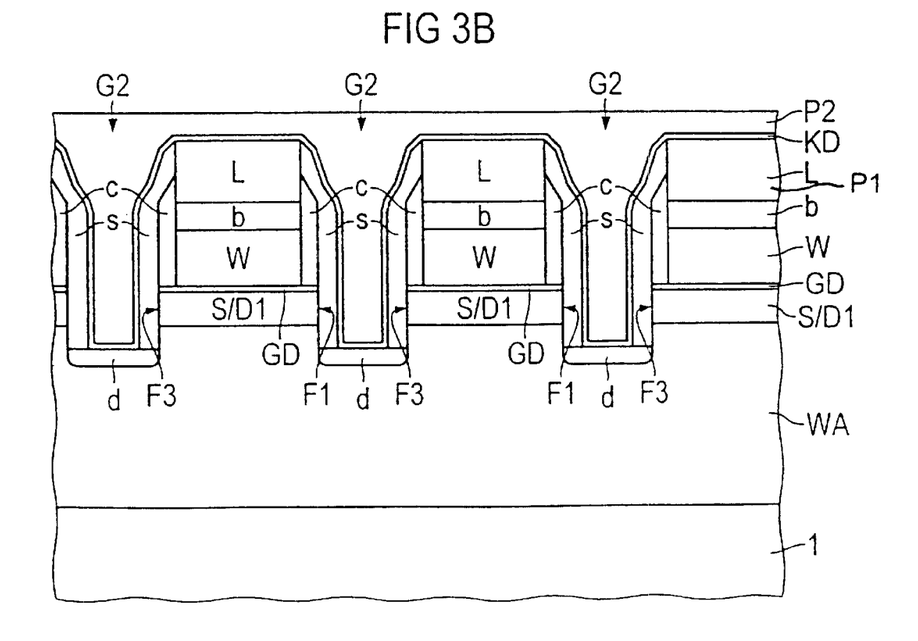

Implantation with p-doping ions is carried out to produce channel stop structures d in the form of channel stop regions at bottoms of the second trenches G2 (see FIG. 3B).

By anisotropically etching silicon nitride selectively with respect to silicon, the insulating structures c in the form of spacers are made smaller in the vertical direction and the auxiliary layer H is removed. As a result of which the second conductive layer L is uncovered at its upper surface and partly at its sidewalls (see FIG. 3B).

By depositing and etching back in-situ-doped polysilicon, vertical conductive structures S are produced along the sidewalls of the second trenches G2, which structures adjoin the second conductive layer L and the insulating structures c in the form of spacers (see FIG. 3B). The vertical conductive structures S in each case overlap either one of the third sidewalls F3 of the first source/drain regions S/D1 or one of the first sidewalls F1 of the first source/drain regions S/D1.

With the aid of a mask analogous to the first mask M1, polysilicon is etched selectively with respect to SiO$_2$ until the second insulating layer b is uncovered. As a result, mutually isolated first capacitor electrodes P1 of capacitors are produced from the second conductive layer L and from the vertical conductive structures S (see FIG. 3A). The vertical conductive structures S each overlap either a first sidewall of parts of the patterned second conductive layer L or a sidewall, opposite the first sidewall, of the parts of the patterned second conductive layer L.

In order to produce a capacitor dielectric KD, silicon nitride is deposited to a thickness of approximately 5 nm and partly oxidized.

In order to produce a second capacitor electrode P2, in-situ-doped polysilicon is deposited to a thickness of approximately 200 nm, the second trenches G2 thereby being filled (see FIGS. 3A and 3B).

Parts of the well WA that are disposed under the first source/drain regions S/D1 are suitable as channel regions KA of the vertical transistors. The well WA defines a threshold voltage of the vertical transistors. Parts of the word lines W that adjoin the channel regions KA act as gate electrodes of the transistors. Parts of the first insulating layer GD which adjoin the gate electrodes act as gate dielectrics. Parts of the bit lines B that are disposed underneath the gate electrodes act as second source/drain regions of the transistors. A memory cell contains one of the transistors and one of the capacitors, which are connected to one another via two of the vertical conductive structures S. The structures "a" prevent the formation of channels at the first sidewalls of the first trenches G1. This ensures that two transistors connected to the same word line W are not connected to the same bit line B. The channel stop regions d disposed at the bottoms of the second trenches G2 prevent the formation of channels between first source/drain regions S/D1 of different transistors, which regions are adjacent to one another transversely with respect to the word line W (see FIG. 3B).

Figure 5:
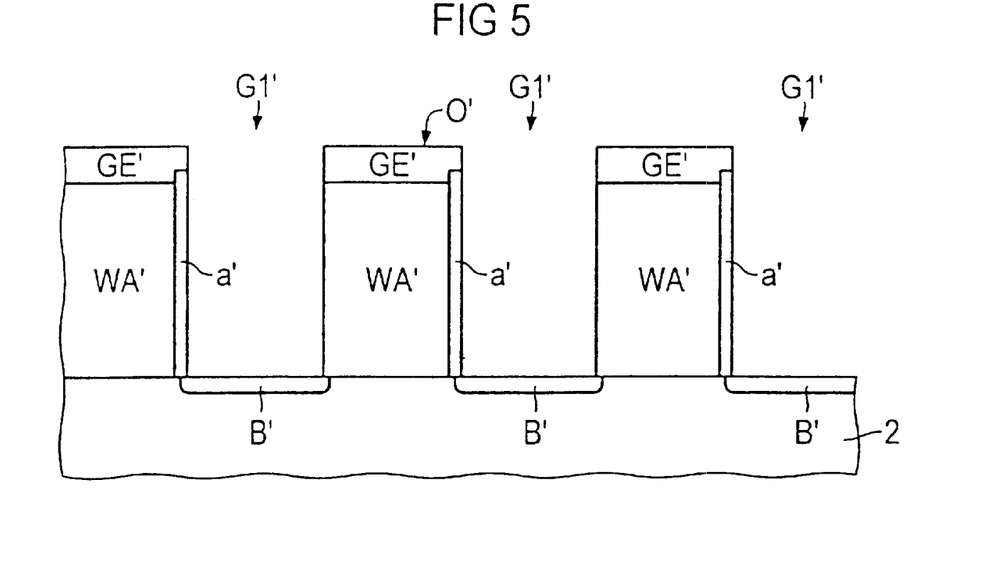
FIG. 5 is a cross-sectional view through a second substrate after a well, first trenches, bit lines, a region and structures which prevent the formation of channels have been produced.

In a second exemplary embodiment, a second substrate 2 having a well WA', first trenches G1', doped regions GE' and bit lines B' are produced in a manner analogous to that in the first exemplary embodiment (FIG. 5).

Inclined implantation with p-doping ions is carried out to produce structures a' in the form of channel stop regions on first sidewalls of the first trenches G1'. The dopant concentration of the structures a' is approximately $5*10^{17}$ cm$^{-3}$ (see FIG. 5).

Figure 6:
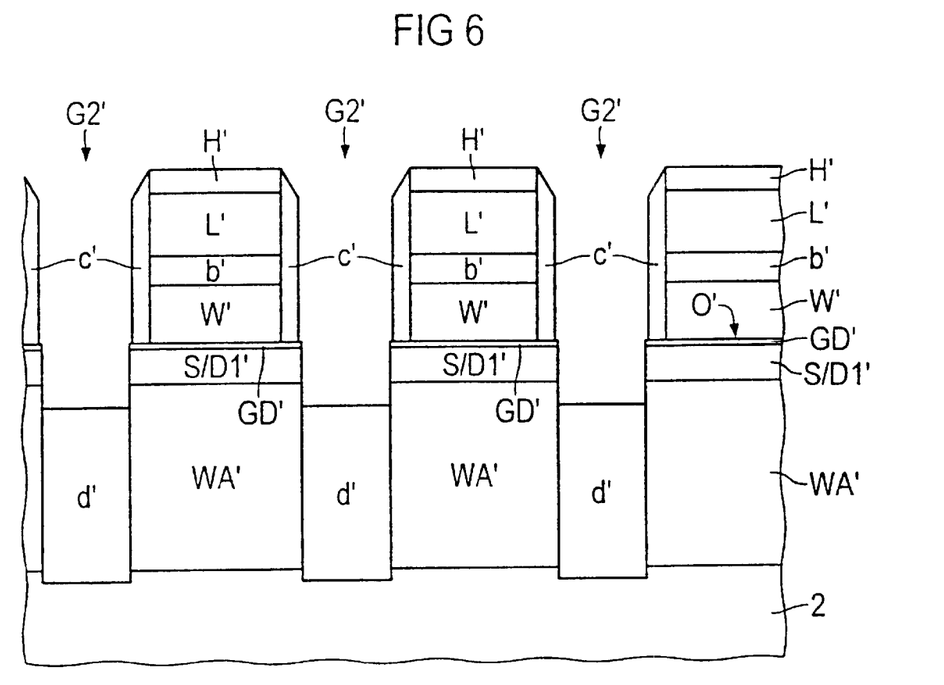
FIG. 6 is a cross-sectional view, perpendicular to the cross-sectional view of FIG. 5, through the second substrate after first source/drain regions, a first insulating layer, word lines, a second insulating layer, a conductive layer, second trenches, insulating structures and channel stop structures have been produced.

Afterwards, in a manner analogous to that in the first exemplary embodiment, a first insulating layer GD' is produced, word lines W' are produced from a first conductive layer, a second insulating layer b', a second conductive layer L', an auxiliary layer H', second trenches G2', first source/drain regions S/D1' and insulating structures C' in the form of spacers are produced (FIGS. 5 and 6).

After the removal of parts of the first insulating layer GD' which are disposed on a surface O' of the second substrate 2, silicon is etched selectively with respect to silicon nitride, as a result of which the second trenches G2' are deepened and extend approximately 800 nm into the second substrate 2. The second trenches G2' cut through the well WA' in the process (see FIG. 6).

By depositing SiO$_2$ to a thickness of approximately 600 nm and etching it back, channel stop structures d' having a thickness of approximately 500 nm are produced along bottoms of the second trenches G2'. An upper area of the channel stop structures d' lies below an upper area of the first source/drain regions S/D1', for which reason parts of sidewalls of the first source/drain regions S/D1' are uncovered (see FIG. 6).

Afterwards, in a manner analogous to that in the first exemplary embodiment, the auxiliary layer H' is removed, the insulating structures c' in the form of spacers are shortened and vertical conductive structures, first capacitor electrodes, a capacitor dielectric and a second capacitor electrode are produced. The channel stop structures d' prevent the formation of channels between first source/drain regions S/D1' which are adjacent to one another transversely with respect to the word line W'. The figures do not reveal that, in the case of the second exemplary embodiment, vertical dimensions of the vertical conductive structures S' are larger than those of the first exemplary embodiment. The capacitance of the capacitor is correspondingly greater than in the first exemplary embodiment.

Figure 8:
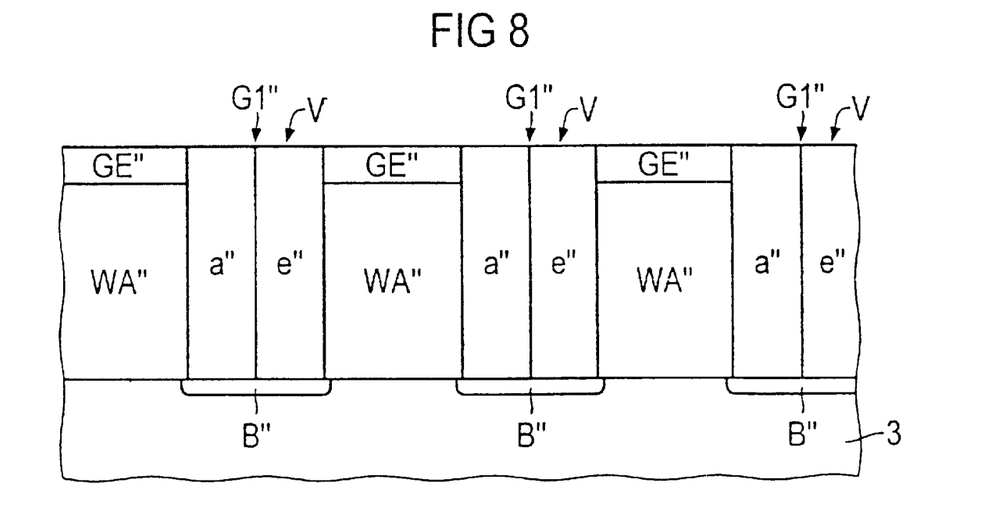
FIG. 8 is a cross-sectional view taken along the line VIII—VIII shown in FIG. 7 through the third substrate after a well, the first trenches, bit lines, a region, structures which prevent the formation of channels, depressions and further insulating structures have been produced.

In a third exemplary embodiment, a third substrate 3 made of silicon and having a well WA" is provided, as in the first exemplary embodiment (see FIG. 8). First trenches G1", bit lines B" and a doped region GE" are produced, as in the first exemplary embodiment. As in the first exemplary embodiment, an insulating material is deposited and planarized, the first trenches G1" thereby being filled with insulating material.

Figure 7:
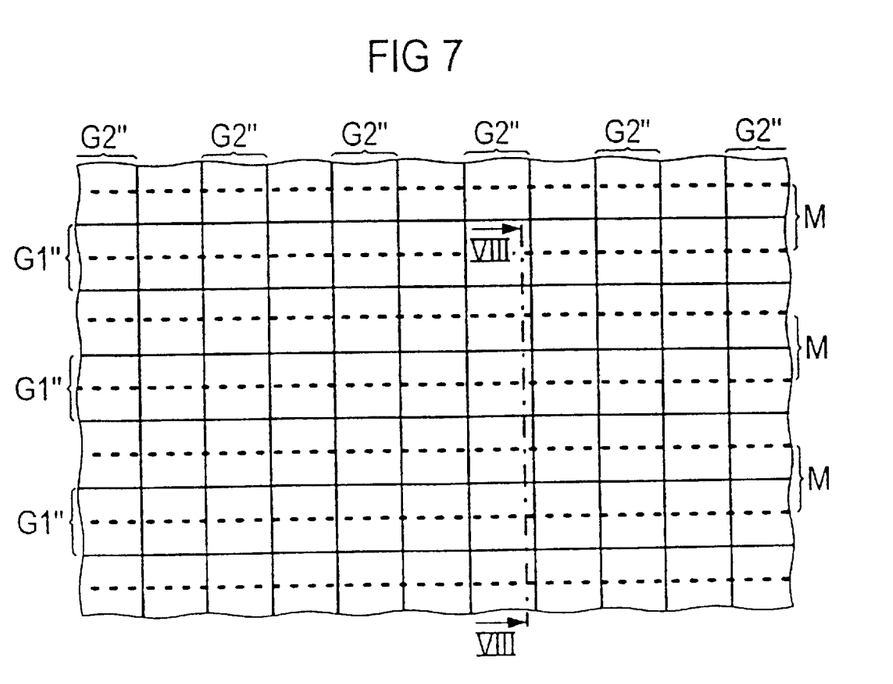
FIG. 7 is a plan view of a third substrate in which first trenches, second trenches and a mask are illustrated.

With the aid of a strip-type photoresist mask M (FIG. 7) whose strips run parallel to the first trenches G1" and cover first sidewalls of the first trenches G1", the insulating material is removed from the second sidewalls of the first trenches G1".

As in the first exemplary embodiment, a first insulating layer, a first conductive layer, a second insulating layer, a second conductive layer, an auxiliary layer and second trenches G2" are produced, whereby word lines are produced from the first conductive layer. Since, in contrast to the first exemplary embodiment, the first conductive layer is disposed along the entire horizontal length of the second sidewalls of the first trenches G1", the second trenches G2" have, in regions in which they cross the first trenches G1", depressions V reaching down to the bottoms of the first trenches G1" and having rectangular cross sections (see FIG. 8). In order to fill these depressions V again, SiO$_2$ is deposited to a thickness of approximately 400 nm and etched back until the doped region G" is uncovered, parts of the first insulating layer which are disposed on the doped region GE" being removed. Further insulating structures e" are produced in the depressions V (see FIG. 8).

Afterwards, in a manner analogous to that in the first exemplary embodiment, insulating structures in the form of spacers, vertical conductive structures, first capacitor electrodes, capacitor dielectric and a second capacitor electrode are produced. Since those parts of the first insulating layer which are disposed on the doped region GE" were removed during the production of the further insulating structures e", the step of removing these parts of the first insulating layer after the production of the insulating structures in the form of spacers, the step being necessary in the first two exemplary embodiments, is omitted in the third exemplary embodiment.

There are many conceivable variations of the exemplary embodiments that likewise lie within the scope of the invention. In particular, the dimensions of the above-described layers, trenches, masks, regions, lines and structures can be adapted as desired to the respective requirements. The same also applies to the proposed dopant concentrations. Conductivity types of the layers, regions and wells can be interchanged.

Features of the three exemplary embodiments can be combined with one another. The structures a' of the second exemplary embodiment, which are configured as channel stop regions and prevent the formation of channels, can be combined with the comparatively shallow second trenches G2 of the first exemplary embodiment. The structures "a" of the first exemplary embodiment, which are formed from insulating material and prevent the formation of channels, can be combined with the comparatively deep second trenches G2' of the second exemplary embodiment. The strip-type photoresist mask M of the third exemplary embodiment, which serves for removing the insulating material from the second sidewalls of the first trenches G1", can also be used for the first exemplary embodiment if deep rather than shallow second trenches are provided. In this case, the cross sections of depressions that are produced during the production of the word lines W are larger than in the case of the third exemplary embodiment, because the structures a which prevent the formation of channels are not composed of insulating material and do not fill parts of the first trenches G1 but rather are channel stop regions.

We claim:

1. An integrated circuit, comprising:

a transistor having a first source/drain region and a second source/drain region;

a capacitor having a dielectric layer, a first capacitor electrode, and a second capacitor electrode adjoining said dielectric layer;

an insulating layer;

a patterned conductive layer disposed above said insulating layer;

a structure through which said transistor can be driven disposed beneath said patterned conductive layer, said insulating layer isolating said structure from said patterned conductive layer;

a vertical conductive structure, formed as a conformal layer, having a first region, a second region and a third region disposed one above another with respect to a vertical axis, said second region disposed between said first region and said third region, said first region of said vertical conductive structure laterally adjoins said patterned conductive layer, said third region of said vertical conductive structure having a vertical sidewall, said sidewall adjoining said first source/drain region of said transistor, said patterned conductive layer and said vertical conductive structure together form said first capacitor electrode of said capacitor, said dielectric layer adjoins said vertical conductive structure and said patterned conductive layer; and an insulating structure laterally adjoins said structure through which said transistor can be driven, said second region of said vertical conductive structure laterally adjoins said insulating structure.

2. An integrated circuit, comprising:

a transistor having a first source/drain region and a second source/drain region;

a capacitor having a dielectric layer, a first capacitor electrode, and a second capacitor electrode adjoining said dielectric layer;

an insulating layer;

a patterned conductive layer disposed above said insulating layer;

a structure through which said transistor can be driven disposed beneath said patterned conductive layer and between said first source/drain region and said patterned conductive layer, said insulating layer isolating said structure from said patterned conductive layer;

a further insulating layer isolating said structure through which said transistor can be driven from said first source/drain region;

a vertical conductive structure having a first region, a second region and a third region disposed one above another with respect to a vertical axis, said second region disposed between said first region and said third region, said first region of said vertical conductive structure laterally adjoins said patterned conductive layer, said third region of said vertical conductive structure adjoining said first source/drain region of said transistor, said patterned conductive layer and said vertical conductive structure together form said first capacitor electrode of said capacitor, said dielectric layer adjoins said vertical conductive structure and said patterned conductive layer;

an insulating structure laterally adjoins said structure through which said transistor can be driven, said second region of said vertical conductive structure laterally adjoins said insulating structure; and said first source/drain region having a first sidewall and a second sidewall, said patterned conductive layer having a first sidewall and a second sidewall, said vertical conductive structure overlapping said first sidewall of said first source/drain region and said first sidewall of said patterned conductive layer.

3. The circuit according to claim 2, wherein said transistor is a vertical transistor disposed under said patterned conductive layer;

wherein said transistor has a channel region disposed under said first source/drain region;

wherein said transistor has a gate electrode disposed on a continuation formed by said channel region and said second sidewall of said first source/drain region, said second sidewall adjoining said first sidewall of said first source/drain region;

including a gate dielectric disposed on said second sidewall of said first source/drain region;

wherein said gate electrode is connected to said structure through which said transistor can be driven; and wherein said further insulation layer is disposed also on said second sidewall of said first source/drain region for electrically insulating said gate electrode from said first source/drain region.

4. The circuit according to claim 2, wherein said transistor and said capacitor form a memory cell configured as a dynamic random access memory;

wherein said structure through which said transistor can be driven is a word line running parallel to said first sidewall of said first source/drain region; and including a bit line connected to said second source/drain region of said transistor.

5. The circuit according to claim 4, including a substrate having a trench formed therein running transversely with respect to said word line and defined by a first sidewall, a second sidewall and a bottom, and said first source/drain region of said transistor disposed between said trench and said word line;

including a further structure for preventing a formation of channels adjoin said first sidewall of said trench; and wherein said transistor has a gate electrode adjoining said second sidewall of said trench, said second sidewall being provided with a gate dielectric.

6. The circuit according to claim 5, wherein said substrate has further trenches formed therein and defined by first sidewalls, second sidewalls and bottoms;

wherein said trench is one of a plurality of trenches formed in said substrate;

wherein said word line is one of a plurality of word lines;

wherein said transistor is one of a plurality of transistors having channel regions, first source/drain regions, and second source/drain regions;

wherein said first source/drain regions of said transistors are adjacent to one another transversely with respect to said word line and are isolated from one another by said further trenches running parallel and between said word lines;

wherein said channel regions of said transistors are disposed adjacent to one another transversely with respect to said word line and are contiguous;

including channel stop structures disposed at said bottoms of said further trenches, said channel stop structures are channel stop regions and prevent a formation of channels; and wherein said vertical conductive structure is disposed in one of said further trenches.

7. The circuit according to claim 5, wherein said substrate has further trenches formed therein defined by first sidewalls, second sidewalls and bottoms;

wherein said trench is one of a plurality of trenches formed in said substrate;

wherein said word line is one of a plurality of word lines;

wherein said transistor is one of a plurality of transistors having channel regions, first source/drain regions, and second source/drain regions;

wherein said first source/drain region of said transistors are adjacent to one another transversely with respect to said word line and are isolated from one another by said further trenches running parallel and between said word lines;

including channel stop structures, formed of an insulating material for preventing a formation of channels, are disposed in said further trenches and adjoin said bottoms of said further trenches; and wherein said vertical conductive structure is disposed in one of said further trenches.

8. The circuit according to claim 7, wherein said bit line is one of a plurality of bit lines, and said second source/drain regions of said transistors are parts of said bit lines which run along bottoms of said trenches.

* * * * *